United States Patent
Gao

(10) Patent No.: US 9,490,828 B1
(45) Date of Patent: Nov. 8, 2016

(54) INTEGRATED CIRCUITS HAVING MULTIPLE DIGITALLY-CONTROLLED OSCILLATORS (DCOS) THEREIN THAT ARE SLAVED TO THE SAME LOOP FILTER

(71) Applicant: Integrated Device Technology, Inc., San Jose, CA (US)

(72) Inventor: Song Gao, Chandler, AZ (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/884,324

(22) Filed: Oct. 15, 2015

(51) Int. Cl.
| | |
|---|---|
| H03L 7/06 | (2006.01) |
| H03L 7/099 | (2006.01) |
| H03L 7/08 | (2006.01) |
| H03L 7/085 | (2006.01) |

(52) U.S. Cl.
CPC ........... *H03L 7/0992* (2013.01); *H03L 7/0802* (2013.01); *H03L 7/085* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 4,686,488 A | 8/1987 | Attenborough | |
| 5,079,521 A | 1/1992 | Gaskell et al. | |
| 6,064,272 A | 5/2000 | Rhee | |
| 6,353,649 B1 | 3/2002 | Bockleman et al. | |
| 6,621,317 B2 | 9/2003 | Saeki | |
| RE40,424 E | 7/2008 | Han et al. | |
| 7,417,510 B2 | 8/2008 | Huang | |
| 7,450,680 B2 | 11/2008 | Mar | |
| 7,532,081 B2 | 5/2009 | Partridge et al. | |
| 7,593,496 B2 | 9/2009 | Fan et al. | |
| 7,724,097 B2 | 5/2010 | Carley et al. | |
| 7,969,251 B2 | 6/2011 | Fu et al. | |
| 8,248,175 B2 | 8/2012 | Hara | |
| 8,441,291 B2 | 5/2013 | Hara et al. | |
| 8,559,587 B1 | 10/2013 | Buell et al. | |
| 8,692,599 B2 | 4/2014 | Gong et al. | |
| 2003/0048863 A1 | 3/2003 | Saeki | |
| 2004/0211819 A1 | 10/2004 | Ezumi et al. | |
| 2005/0094757 A1 | 5/2005 | Meninger et al. | |

(Continued)

OTHER PUBLICATIONS

Efstathiou, Dimitrios, "A Digital Loop Filter for a Phase Locked Loop", 17th International Conference on Digital Signal Processing (DSP), 2011, © 2011 IEEE, pp. 1-6. Floyd, Brian A., "Sub-Integer Frequency Synthesis Using Phase-Rotating Frequency Dividers", IEEE Transactions on Circuits and Systems—I: Regular Papers, vol. 55, No. 7, Aug. 2008, pp. 1823-1833.

(Continued)

*Primary Examiner* — Adam Houston
(74) *Attorney, Agent, or Firm* — Myers Bigel & Sibley PA.

(57) ABSTRACT

A phase-locked loop (PLL) integrated circuit includes multiple digitally-controlled oscillators (DCOs), which are slaved to the same feedback loop filter. This PLL includes a frequency control circuit, which is configured to generate a control signal and is responsive to a first periodic reference signal (e.g., REFCLK). The plurality of DCOs include a corresponding plurality of independently-programmable fractional dividers, which are configured to generate a respective plurality of periodic PLL output signals of different frequency in response to a second periodic reference signal (e.g., SYSCLK). The plurality of DCOs include corresponding scaling circuits, which are each responsive to the control signal. The plurality of scaling circuits are configured to scale the control signal to different degrees to thereby make effective gains of the DCOs more nearly equal.

11 Claims, 9 Drawing Sheets

(56) References Cited

U.S. PATENT DOCUMENTS

2011/0095830 A1     4/2011    Tsangaropoulos et al.
2015/0222284 A1*   8/2015    Evans .................... H03L 7/081
                                                                                 327/107

OTHER PUBLICATIONS $I^2$ C-Programmable Any-Frequency, Any-Output Quad Clock Generator—Si5338, Silicon Labs, Rev.1.0 1/11, Copyright © 2011 by Silicon Laboratories, 42 pages.

Rohde, Ulrich L., Synthesizer Design for Microwave Application, Department of Electrical Engineering, Universities of Oradea, Bradford, and George Washington, Copyright © 1999, by Ulrich L. Rohde—p. 1 of 51.

S. Pamarti et al., entitled "A Spur Elimination Technique for Phase Interpolation-Based Fractional-N PLLs", IEEE Trans. on Circuits and Systems, vol. 55, No. 6, pp. 1639-1647, Jul. 2008.

Shu et al., CMOS PLL Synthesizers: Analysis and Design, Chapter 2, Springer Science+Business Media, 2005, pp. 16-19.

Zhang et al., entitled "A Hybrid Spur Compensation Technique for Finite-Modulo Fractional-N Phase-Locked Loops", IEEE Journal of Solid-State Circuits, vol. 44, No. 11, pp. 2922-2934, Nov. 2009.

* cited by examiner

INTEGRATED CIRCUITS HAVING MULTIPLE DIGITALLY-CONTROLLED OSCILLATORS (DCOS) THEREIN THAT ARE SLAVED TO THE SAME LOOP FILTER

CROSS-REFERENCE TO RELATED APPLICATION

This application is related to U.S. application Ser. No. 14/573,146, filed Dec. 17, 2014, entitled "Fractional Divider Based Phase Locked Loops with Digital Noise Cancellation," now U.S. Pat. No. 9,236,873, the disclosure of which is hereby incorporated herein by reference.

FIELD OF THE INVENTION

The present invention relates to frequency synthesizer circuits and, more particularly, to frequency synthesizer circuits for generating multiple clock families.

BACKGROUND

Fractional-N frequency synthesizers can be used to overcome many limitations associated with integer-N frequency synthesizers. In fractional-N frequency synthesizers, the effective frequency divide ratio is a fractional number, which enables a relatively high frequency reference signal to be used to achieve fine resolution of frequencies in synthesizer output signals. This fractional number is typically achieved by periodically changing an integer divide ratio so that a desired fractional number can be approximated. One typical disadvantage associated with fractional-N frequency synthesis is the generation of unwanted low-frequency "spurs" by a dual-modulus (or multi-modulus) divider. These spurs make fractional-N frequency synthesizers impractical for many applications unless they are suppressed to a negligible level. Conventional spur reduction techniques include: (i) digital-to-analog (DAC) phase estimation, (ii) random jittering, which randomizes a divide ratio, (iii) sigma-delta (ΣΔ) noise shaping, which modulates a divide ratio, (iv) phase interpolation; and (v) pulse generation. Some of these spur reduction techniques are disclosed in articles by: S. Pamarti et al., entitled "A Spur Elimination Technique for Phase Interpolation-Based Fractional-N PLLs", IEEE Trans. on Circuits and Systems, Vol. 55, No. 6, pp. 1639-1647, July (2008); and Li Zhang et al., entitled "A Hybrid Spur Compensation Technique for Finite-Modulo Fractional-N Phase-Locked Loops", IEEE Journal of Solid-State Circuits, Vol. 44, No. 11, pp. 2922-2934, November (2009).

As illustrated by FIG. 1A, a frequency synthesizer 10 may include a fractional-N divider 12 within a feedback path of a phase-locked loop (PLL), which filters jitter in the output of the divider 12. This fractional-N divider 12 may operate by modulating between two or more integer values. The phase-locked loop of FIG. 1A contains a phase detector 14, which receives an input reference signal (e.g., 25 MHz), a charge pump 16, a loop filter 18 and a voltage-controlled oscillator (VCO) 20. This VCO 20 generates an output signal having a frequency that is a non-integer multiple of the frequency of the input reference signal. An integer divider 22 may also be provided for generating an output signal at a reduced frequency relative to the VCO output signal. Examples of the frequency synthesizer 10 of FIG. 1A are disclosed at U.S. Pat. No. 7,532,081 to Partridge et al., entitled "Frequency and/or Phase Compensated Microelectromechanical Oscillator," and FIG. 3 of U.S. Pat. No. 7,417,510 to Huang, entitled "Direct Digital Interpolative Synthesis".

FIG. 1B illustrates a frequency synthesizer 10', which includes an integer divider 12' within a feedback path of a phase-locked loop (PLL). This phase-locked loop contains a phase detector 14, which receives an input reference signal (e.g., 25 MHz), a charge pump 16, a loop filter 18 and a voltage-controlled oscillator (VCO) 20, which generates an output signal having a frequency that is an integer multiple of the frequency of the input reference signal. Multiple fractional-N dividers 22a-22d may be provided for generating output signals having different frequencies, which do not have integer relationships with the output frequency of the VCO 20. As will be understood by those skilled in the art, additional circuitry may be needed to reduce jitter in the signals generated by the dividers 22a-22d. The dividers 22a-22d may be provided as interpolative dividers as disclosed at FIGS. 4-6 of the '510 patent to Huang. For example, as shown by FIG. 5 of Huang, an interpolative divider can include a fractional-N divider, which receives a VCO clock. A first order delta sigma modulator receives a digital divide ratio (M/N). The integer portion of the digital divide ratio is supplied to the fractional-N divider as a divide control signal, which can be a stream of integers that approximate the fractional divide ratio. A digital quantization error, which corresponds to the fractional portion of the divide ratio, is supplied to a digitally controlled phase interpolator. The jitter introduced by the fractional-N divider can be canceled by interpolation in the phase interpolator, which is based on the digital quantization error supplied by the delta sigma modulator. In this manner, the input clock from the VCO is first divided down by the fractional-N divider according to the control information provided by the delta sigma modulator and then the phase interpolator operates to cancel quantization errors in the output of the fractional-N divider.

Additional examples of fractional-N frequency synthesizers, which utilize an accumulator within a numerically-controlled oscillator and a phase interpolator, are disclosed at FIG. 6 of the '510 patent to Huang and in U.S. Pat. No. 7,724,097 to Carley et al., entitled "Direct Digital Synthesizer for Reference Frequency Generation." Digitally-controlled oscillators containing interpolative dividers are also disclosed in U.S. Pat. No. 8,441,291 to Hara et al., entitled "PLL Using Interpolative Divider as Digitally Controlled Oscillator," and U.S. Pat. No. 8,248,175 to Hara, entitled "Oscillator with External Voltage Control and Interpolative Divider in the Output Path."

Still further examples of fractional-N frequency synthesizers are disclosed in commonly assigned U.S. Pat. No. 8,559,587 to Buell et al., entitled "Fractional-N Dividers Having Divider Modulation Circuits Therein with Segmented Accumulators," the disclosure of which is hereby incorporated herein by reference. In particular, in FIGS. 2A-2B of the '587 patent, a fractional-N divider circuit 100 is illustrated as including a multi-modulus divider 102, which is configured to perform at least /N and /N+1 frequency division of a first reference signal ($REF_{HF}$) received at a first input thereof, where N is an integer greater than one. This multi-modulus divider 102 selectively performs a /N and /N+1 division according to a value of an overflow signal (OVERFLOW) received at a second input thereof. This overflow signal is generated by a divider modulation circuit and phase error calculator 104, which is shown as the divider modulation circuit 104a and the phase error calculator 104b. In particular, the overflow signal is generated in response to a digital code that specifies the sequence of division moduli to be used by the multi-modulus divider 102 when performing the /N and /N+1 frequency division of the first reference signal $REF_{HF}$.

The divider modulation circuit and phase error calculator 104 of FIG. 2A includes an accumulator 106 having multiple serially-cascaded accumulator segments 106a-106n therein. These segments 106a-106n generate a corresponding plurality of segments of a count value having at least one period of clock latency therebetween, in response to corresponding bits (LSB, . . . , MSB) of a digital code and corresponding segment overflow signals. The segments 106a-106n may be synchronized with a clock signal, which is shown as a signal ($f_1$) generated by the divider 102. For example, a relatively wide 16-bit segmented accumulator, which is typically needed for high resolution, may be defined by a cascaded arrangement of four 4-bit accumulator segments. The segmented accumulator 106 may provide advantages over typical accumulators within conventional delta-sigma modulators because the per cycle delay through the divider modulation circuit 104a is equivalent to the delay through a single segment (106a, . . . , 106n) of the accumulator 106, which may need to run at twice a frequency of an output signal (e.g., $F_{OUT}$). In this manner, the segments of the accumulator 106 operate collectively as an adder with at least one cycle (and typically many cycles) of latency. This segmented "adder" does not generate accurate counts with each clock signal, but ultimately yields a correct, albeit delayed, sequence of final overflow signals (from segment 106n) at a potentially much higher frequency rate. As further illustrated by FIG. 2A, the phase error calculator 104b includes a segment (e.g., four-bit) delay block 105a that compensates for the latency between the accumulator segment values associated with segments 106n-1 and 106n. An additional accumulator segment 107 and delay block 105b, which are optional, may be used within the phase error calculator 104b to produce a delta-sigma modulated signal that represents the value in the lower accumulator segments that do not directly feed a phase correction circuit 110.

This phase correction circuit 110 is configured to generate a second reference signal ($F_{OUT}$) in response to the divider output signal ($f_1$) generated by the multi-modulus divider 102. The phase correction circuit 110 includes a D-type flip-flop 112, which has a data terminal responsive to the second reference signal $F_{OUT}$ and a synchronization terminal responsive to the divider output signal $f_1$, and a pulse-width locked loop 114. This pulse-width locked loop 114 may include, among other things, an analog phase interpolator and a digital phase selection circuit, as shown by FIG. 2B.

The phase correction circuit 110 is illustrated as including a pulse-width locked loop 114 that utilizes a delay line containing a plurality of voltage-controlled delay cells 116a-116e to achieve a delay of one VCO period and an additional VCO cell 116f to provide equivalent loading. The pulse-width locked loop 114 further includes an XOR gate 118, which operates as a pulse generator to generate a pulse having a width of four delay blocks from the delay line, a charge pump 120 and capacitive loop filter $C_L$. As shown by the four inputs to each of the pair of multiplexers 122a-122b, digital phase selection in fine steps of $T_{VCO}/4$ can be achieved with analog phase interpolation being performed between these finer steps by an output multiplexer 124. This configuration yields two (2) bits of resolution allocated to the multiplexers and additional bits of resolution in the analog phase interpolator. Although not wishing to be bound by any theory, because the edges of the signals provided to the phase interpolator are closely spaced, they typically do not need to be filtered. The close spacing may also yield greater linearity and preclude any need for trimming.

Referring now to FIG. 3, another conventional fractional-N divider circuit 100' is shown as including a multi-modulus divider 102, which is configured to perform at least /N and /N+1 frequency division of a first reference signal ($REF_{HF}$) received at a first input thereof, where N is an integer greater than one. This multi-modulus divider 102 selectively performs a /N and /N+1 division according to a value of an overflow signal (OVERFLOW) received at a second input thereof. This overflow signal is generated by a divider modulation circuit and phase error calculator 104. In particular, the overflow signal is generated in response to a digital code that specifies the sequence of division moduli to be used by the multi-modulus divider 102 when performing the /N and /N+1 frequency division of the first reference signal $REF_{HF}$.

The divider modulation circuit 104a includes an accumulator 106 having multiple serially-cascaded accumulator segments 106a-106n therein. These segments 106a-106n generate a corresponding plurality of segments of a count value having at least one period of clock latency therebetween, in response to corresponding bits (LSB, . . . , MSB) of a digital code and corresponding segment overflow signals. The phase error calculator 104b includes a plurality of delay elements 105a-150b and an additional accumulator segment 107, which collectively generate multiple bits of a digital phase error that is provided to a phase correction circuit 110'. The accumulator segments 106a-106n and 107 are synchronized with a high frequency clock signal, which may be generated by a frequency multiplier 109.

This phase correction circuit 110' is configured to generate a second reference signal ($F_{OUT}$) in response to a divider output signal ($f_1$) generated by the multi-modulus divider 102. The phase correction circuit 110' is configured so that the second reference signal ($F_{OUT}$) has a substantially jitter-free and uniform duty cycle. The phase correction circuit 110' is illustrated as including a pair of latches (e.g., D-type flip-flops) 112a-112b, which have data terminals responsive to the second reference signal $F_{OUT}$ and synchronization terminals (e.g., clock terminals) responsive to true and complementary versions of the divider output signal $f_1$, which operates as a duty cycle adjustment circuit, and an analog phase interpolator 114'. This phase interpolator 114' may be configured as an analog multiplexer, which combines two edges of the signals generated by the flip-flops 112a-112b that are separate by one VCO period. Programmable filters 117a-117c are also provided for adjusting the edge rates of the input and output signals and, therefore, the linearity of the analog phase interpolator 114'.

SUMMARY OF THE INVENTION

A phase-locked loop (PLL) integrated circuit includes multiple digitally-controlled oscillators (DCOs), which are slaved to the same feedback loop filter. According to some embodiments of the invention, a "multi-family" PLL includes a frequency control circuit, which is configured to generate a control signal (e.g., $\Delta f_{ppm}$) in response to a first periodic reference signal (e.g., REFCLK). The DCOs include a corresponding plurality of independently programmable fractional dividers, which generate a respective plurality of periodic PLL output signals of different frequency in response to the control signal and a second periodic reference signal (e.g., SYSCLK). The slaving of the multiple DCOs to the same feedback loop filter can be achieved by using a respective scaling circuit within each of the DCOs, with each scaling circuit responsive to the same control signal.

According to additional embodiments of the invention, the plurality of fractional dividers are programmed to have different nominal gains to with different divisors thereby generate PLL output signals having different frequencies. Advantageously, the scaling circuits are configured to scale/normalize the control signal to different degrees to thereby make the effective gains of the fractional dividers more nearly equal and thereby yield a plurality of periodic PLL output signals have essentially equivalent fractional frequency offsets (FFOs).

According to additional embodiments of the invention, the frequency control circuit may include a phase detector (PD) having a first input terminal, which is responsive to the first periodic reference signal, and a low pass "loop" filter (LPF), which is responsive to a signal generated at an output terminal of the PD. In addition, the control signal can be derived directly from a signal generated at an output terminal of the LPF. The frequency control circuit may also include a feedback divider (FD), which is responsive to one of the plurality of periodic PLL output signals, and a second input terminal of the PD may be responsive to a periodic feedback signal generated by the FD.

According to still further embodiments of the invention, the scaling circuits are configured so that a first of the plurality of periodic PLL output signals associated with a first of the plurality of independently programmable fractional dividers has a frequency equal to $f_{Q0}$, where $f_{Q0}=f_{sysclk}(1/[(int_0+frac_0)(1+\Delta f)])$, $f_{sysclk}$ designates a frequency of the second periodic reference signal, $int_0+frac_0$ represents a programmed divisor associated with the first of the plurality of independently programmable fractional dividers and $\Delta f$ (e.g., $\Delta f_{ppm}$) is a value of the control signal. Similarly, a second of the plurality of periodic PLL output signals associated with a second of the plurality of independently programmable fractional dividers has a frequency equal to $f_{Q1}$, where $f_{Q1}=f_{sysclk}(1/[(int_1+frac_1)(1+\Delta f)])$, and $int_1+frac_1$ represents a programmed divisor associated with the second of said plurality of independently programmable fractional dividers. A value of the control signal may also be determined according to the following relationship: $\Delta f=f_{sysclk}(f_{refclk}(Fb)(int_0+frac_0))^{-1}-1$, where $f_{refclk}$ designates a frequency of the first periodic reference signal and Fb is the divisor of the FD.

DETAILED DESCRIPTION OF EMBODIMENTS

Figure 1A:
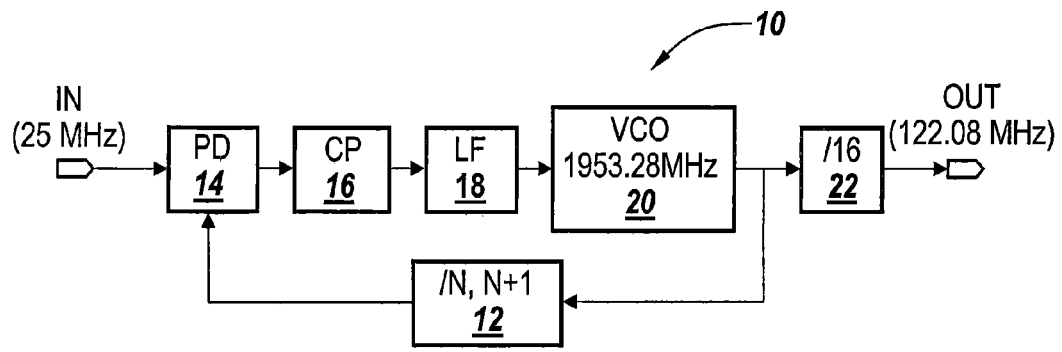
FIG. 1A is a block diagram of a frequency synthesizer that utilizes a fractional-N divider within a feedback path of a phase-locked loop (PLL), according to the prior art.
Figure 1B:
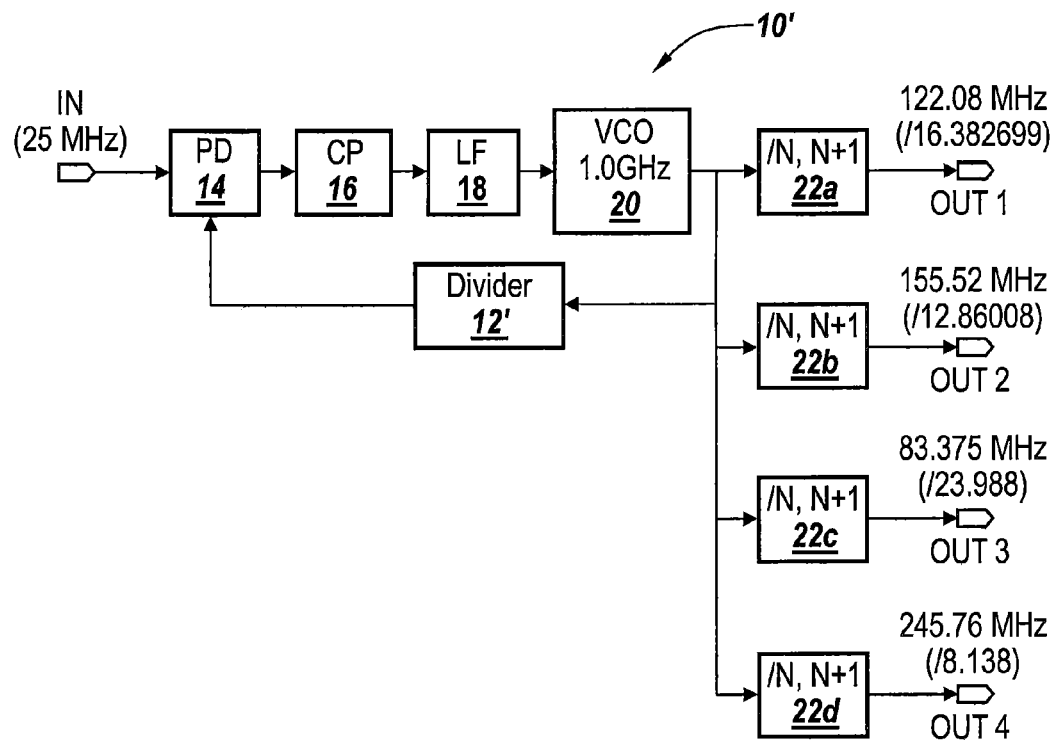
FIG. 1B illustrates a frequency synthesizer that utilizes an integer divider within a feedback path of a phase-locked loop (PLL), according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element is referred to as being "on," "connected to" or "coupled to" another element, it can be directly connected or coupled to the other element or an intervening element(s) may be present. In contrast, when an element is referred to as being "directly connected to" or "directly coupled to" another element, there are no intervening elements present.

It will be understood that, although the terms first, second, third, etc. may be used herein to describe various elements, components, regions and/or sections, these elements, components, regions and/or sections should not be limited by these terms. These terms are only used to distinguish one element, component, region or section from another region or section. Thus, a first element, component, region or section discussed below could be termed a second element, component, region or section without departing from the teachings of the present invention.

As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which the present invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
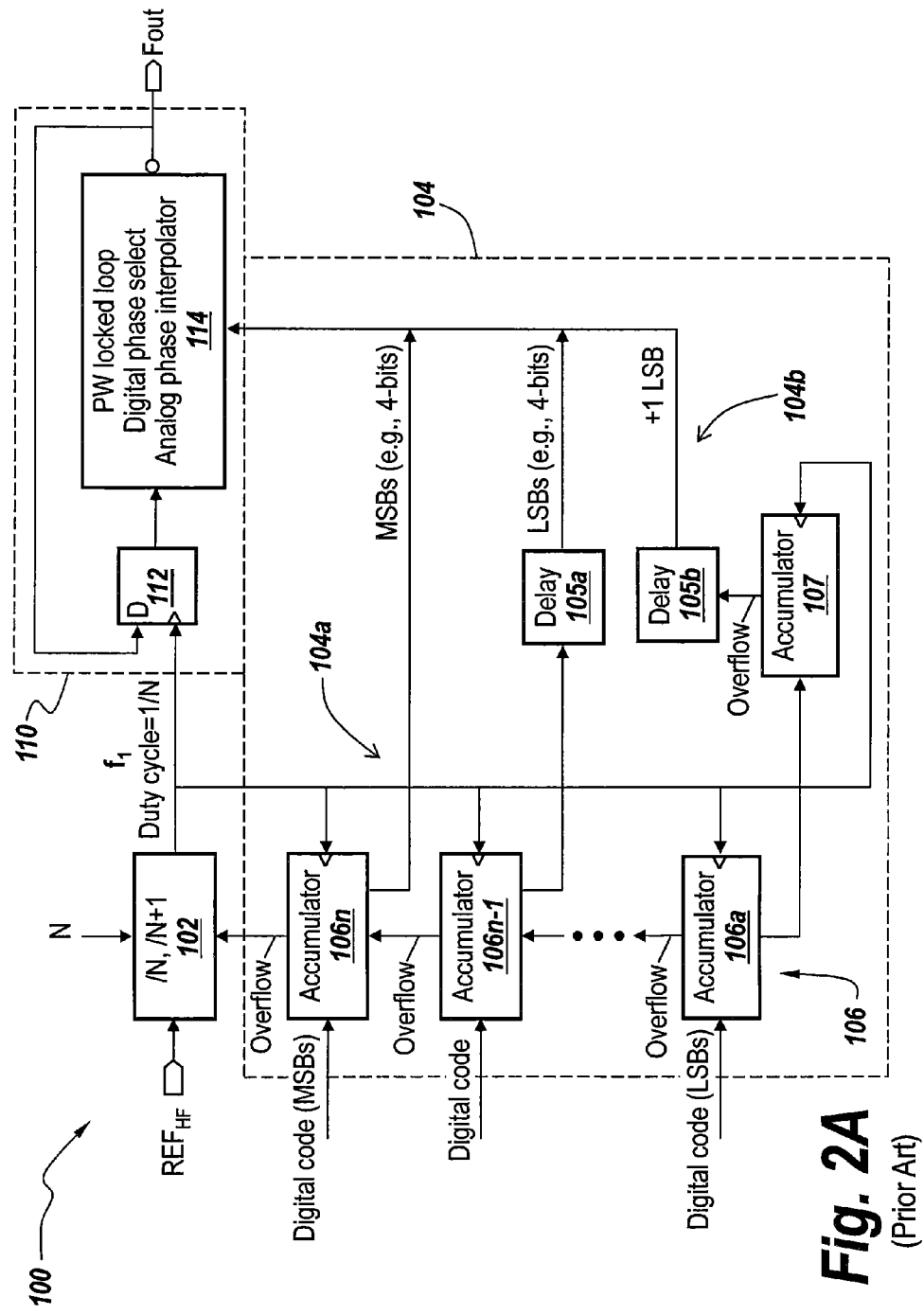
FIG. 2A is a block diagram of a fractional-N divider circuit containing a segmented accumulator, according to the prior art.
Figure 2B:
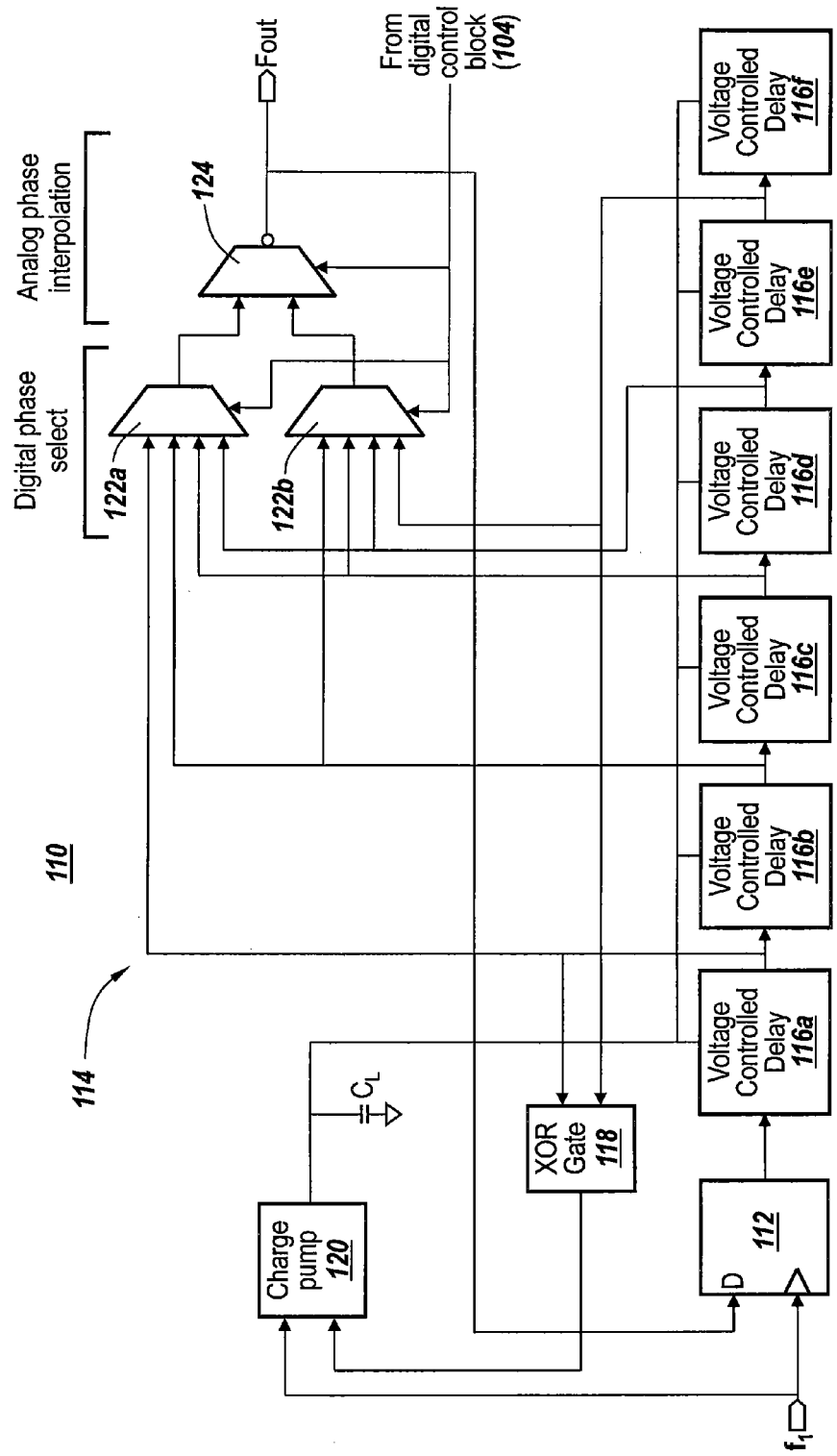
FIG. 2B is a block diagram of an embodiment of the phase correction circuit of FIG. 2A.
Figure 3:
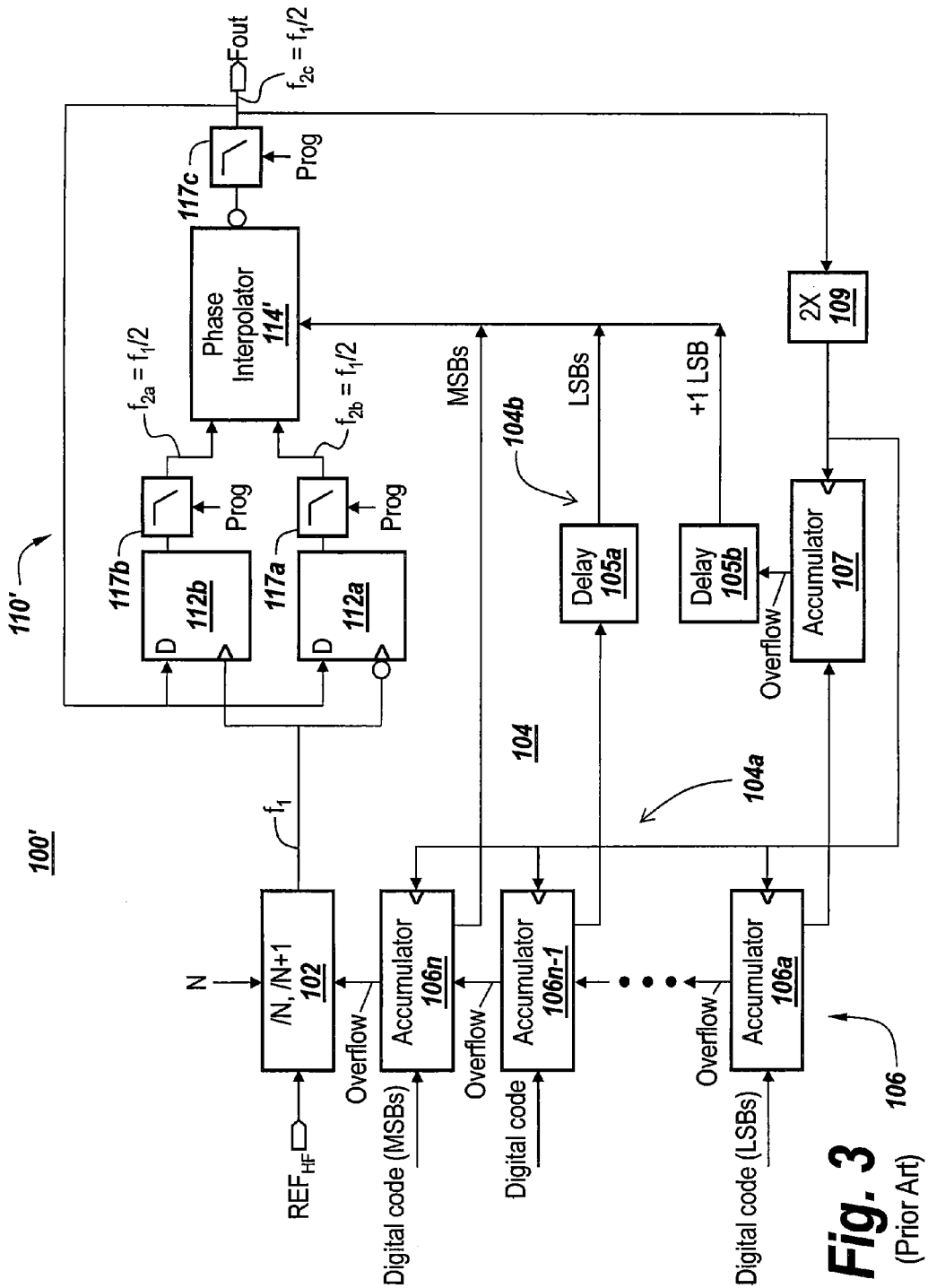
FIG. 3 is a block diagram of a fractional-N divider circuit containing a segmented accumulator, according to the prior art.
Figure 4:
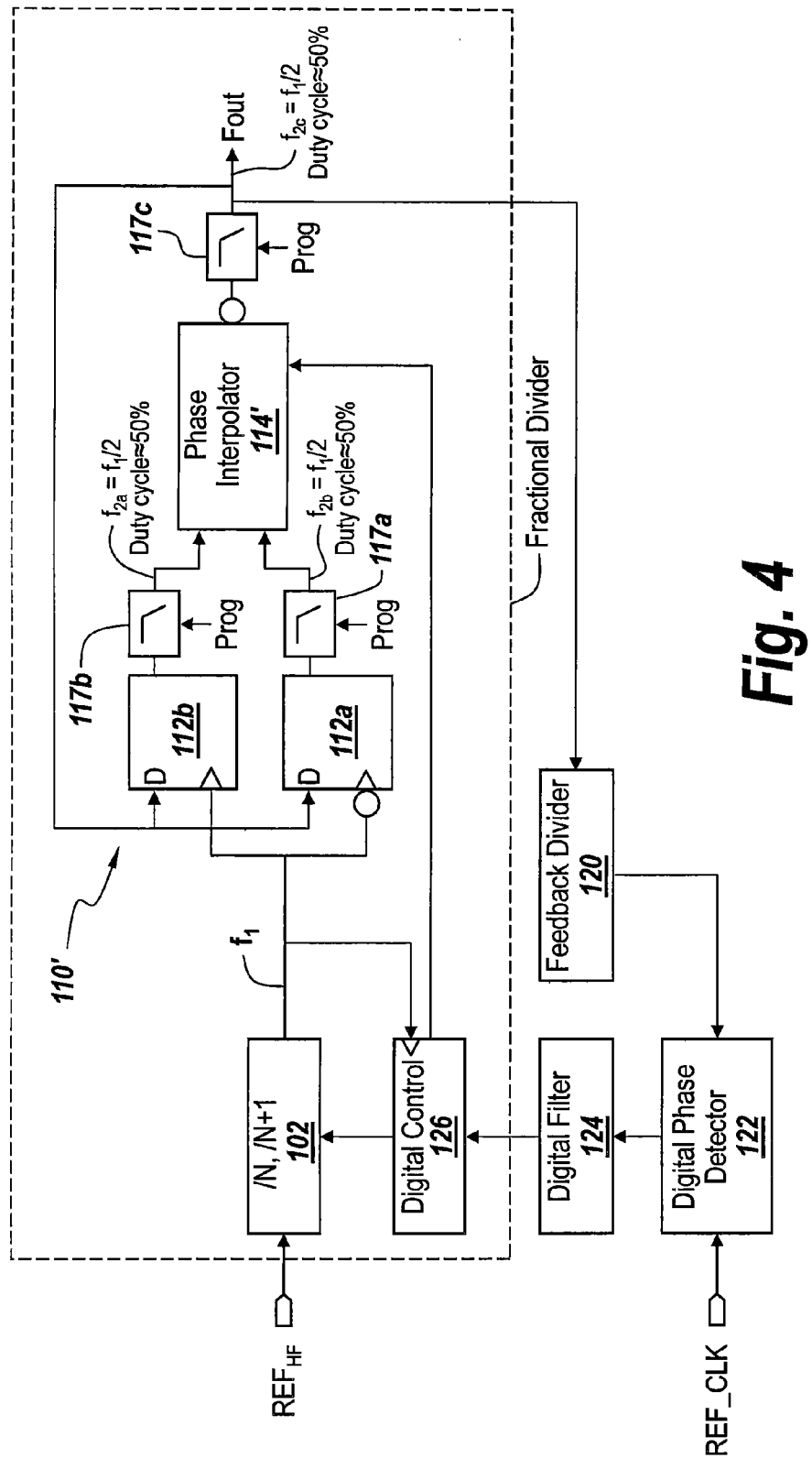
FIG. 4 is a block diagram of a PLL integrated circuit, which adds components to a conventional fractional divider.

As illustrated by FIG. 4, a fractional divider may be utilized in a forward signal path of a phase-locked loop (PLL) integrated circuit, by adding a feedback signal path utilizing a digital phase detector 122, a digital loop filter 124 and a feedback divider 120, connected as illustrated. This embodiment of a fractional divider is illustrated as including a digital control circuit 126, a multi-modulus divider (MMD) 102 and a phase correction circuit 110'. The operations of these components of the fractional divider are more fully described hereinabove with respect to FIGS. 2A-2B and 3 and in the aforementioned commonly assigned '587 patent, which is hereby incorporated herein by reference. One potential limitation in the performance of the fractional divider based PLL of FIG. 4 stems from the fact that the potentially high fidelity PLL analog output signal (Fout) may be fed back to produce a lower frequency and relatively noise free (e.g., jitter free) feedback signal to an input of the digital phase detector 122, which performs phase comparison operations relative to REF_CLK. As will be understood by those skilled in the art, a less active signal(s) at the input(s) of the digital phase detector 122 can increase a likelihood of "dead-zone" operation therein, which can limit performance of the PLL.

Figure 5A:
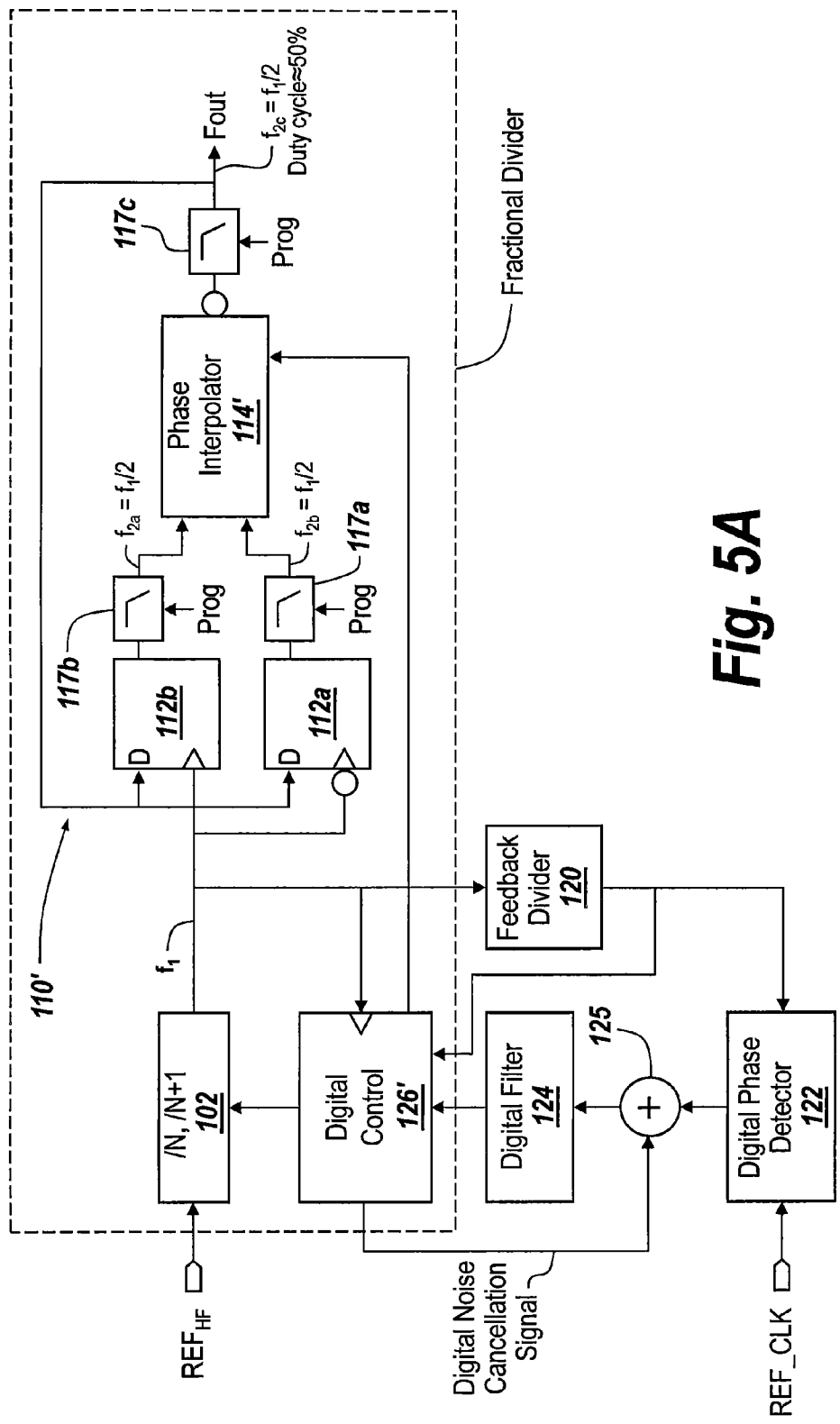
FIG. 5A is a block diagram of a PLL integrated circuit with digital noise cancellation.

Referring now to FIG. 5A, a fractional divider based phase-locked loop (FDPLL) is illustrated as including a modified digital control circuit 126' within a fractional divider, and a feedback circuit including a feedback divider 120, a digital phase detector 122, a digital adder 125 and a digital loop filter 124, connected as illustrated. As shown, the digital adder 125 operates to combine a digital noise cancellation signal generated by the digital control circuit 126' with a signal generated at an output of the digital phase detector 122.

As will now be described with respect to FIGS. 5A-5B, a fractional divider based phase-locked loop (FDPLL) can be less susceptible to "dead-zone" operation within the digital phase detector 122 and may have higher resolution and better linearity compared to the PLL of FIG. 4. To achieve this enhanced level of operation, a more "active" signal is provided as feedback to an input of the digital phase detector 122. This more active input signal is derived from an output signal ($f_1$) generated by the multi-modulus divider (MMD) 102, which is passed through a feedback frequency divider 120 to a first input of the digital phase detector 122, as illustrated. This higher degree of "activity" in the feedback signal provided to the digital phase detector 122 is a consequence of a higher level of non-random deterministic "noise" (e.g., jitter) in the MMD output signal ($f_1$), which is created as a direct consequence of the modulus control (i.e., /N versus /N+1) provided by the digital control circuit 126'. Because this modulus control results in deterministic "noise" (e.g., known jitter) in the MMD output signal ($f_1$), it can be digitally removed from an output of the digital phase detector 122, as described more fully hereinbelow.

In FIG. 5A, the feedback divider 120 within the feedback circuit generates a reduced frequency output signal in response the MMD output signal ($f_1$). This feedback divider 120, which may be an integer or fractional divider, also provides the reduced frequency output signal as a synchronizing signal to the digital control circuit 126', as explained more fully hereinbelow with respect to FIG. 5B. Using known operations, the digital phase detector 122 generates a phase detector output signal in response to determining a phase difference between a reference clock (REF_CLK) and the reduced frequency output signal generated by the feedback divider 120. The phase detector output signal is provided to the digital adder 125 and modified by the noise cancellation signal generated by the digital control circuit 126', as shown. The digital loop filter 124 receives the modified phase detector output signal and performs a digital filtering operation using known techniques. An output signal generated by the digital loop filter 124 is provided as an input data signal to the digital control circuit 126'. As shown by FIG. 5B, the multi-bit signal generated by the digital loop filter 124 includes integer and fractional components, which are provided to the digital adder 127 and accumulator 130, respectively. Using known techniques, such as those described in the aforementioned '587 patent, the digital adder 127 combines the integer component of the output signal generated by the digital loop filter 124 with an overflow signal generated by the accumulator 130. As will be understood by those skilled in the art, the accumulator is synchronized to the MMD output signal ($f_1$).

Figure 5B:
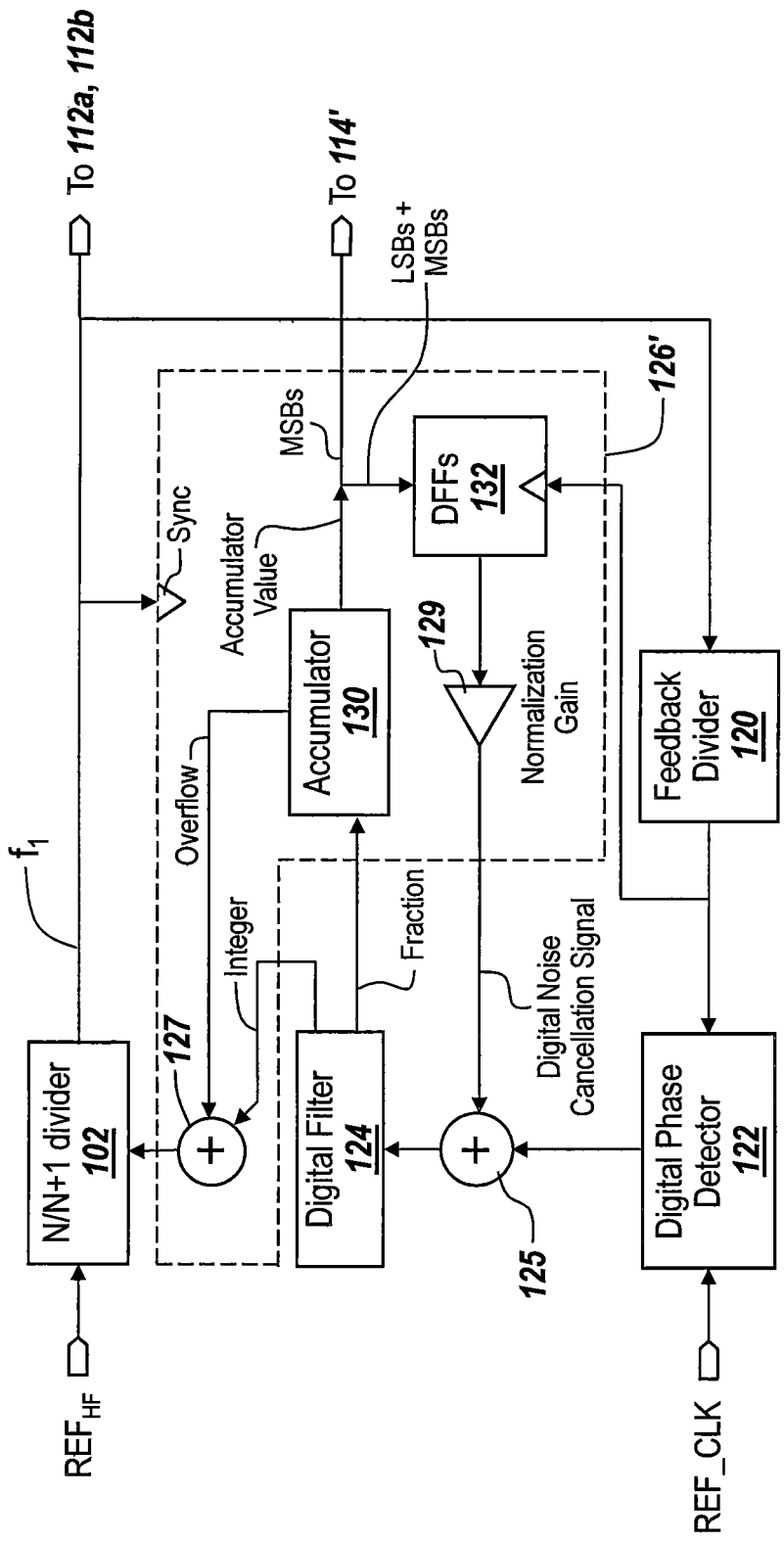
FIG. 5B is a block diagram of a portion of the PLL integrated circuit of FIG. 5A.

As further shown by FIG. 5B, the most significant bits (e.g., 8 MSBs) of the accumulator value signal generated by the accumulator 130 are provided to control operation of the analog phase interpolator 114' within the fractional divider. In contrast, the most significant bits and least significant bits (LSBs) of the accumulator value signal are provided to an M-bit register 132, which may be configured from D-type flip-flops (DFFs) that are synchronized to the reduced frequency output signal generated by the feedback divider 120. Based on calibration operations performed during start-up, etc., a programmable non-unity digital scaling operation (e.g., normalization) may be performed on the M-bit output of the register 132 to thereby yield a digital noise cancellation signal, which is provided to the digital adder 125. Although not wishing to be bound by any theory, an accumulator value calculated within a circuit that controls operation of the MMD 102 and analog phase interpolator 114' can be used to provide digital noise cancellation in the PLL feedback circuit. This noise cancellation, as described herein, can have higher resolution and better linearity compared with "analog" noise cancellation, which can be achieved by feeding back the PLL output signal, as shown by FIG. 4.

Figure 6A:
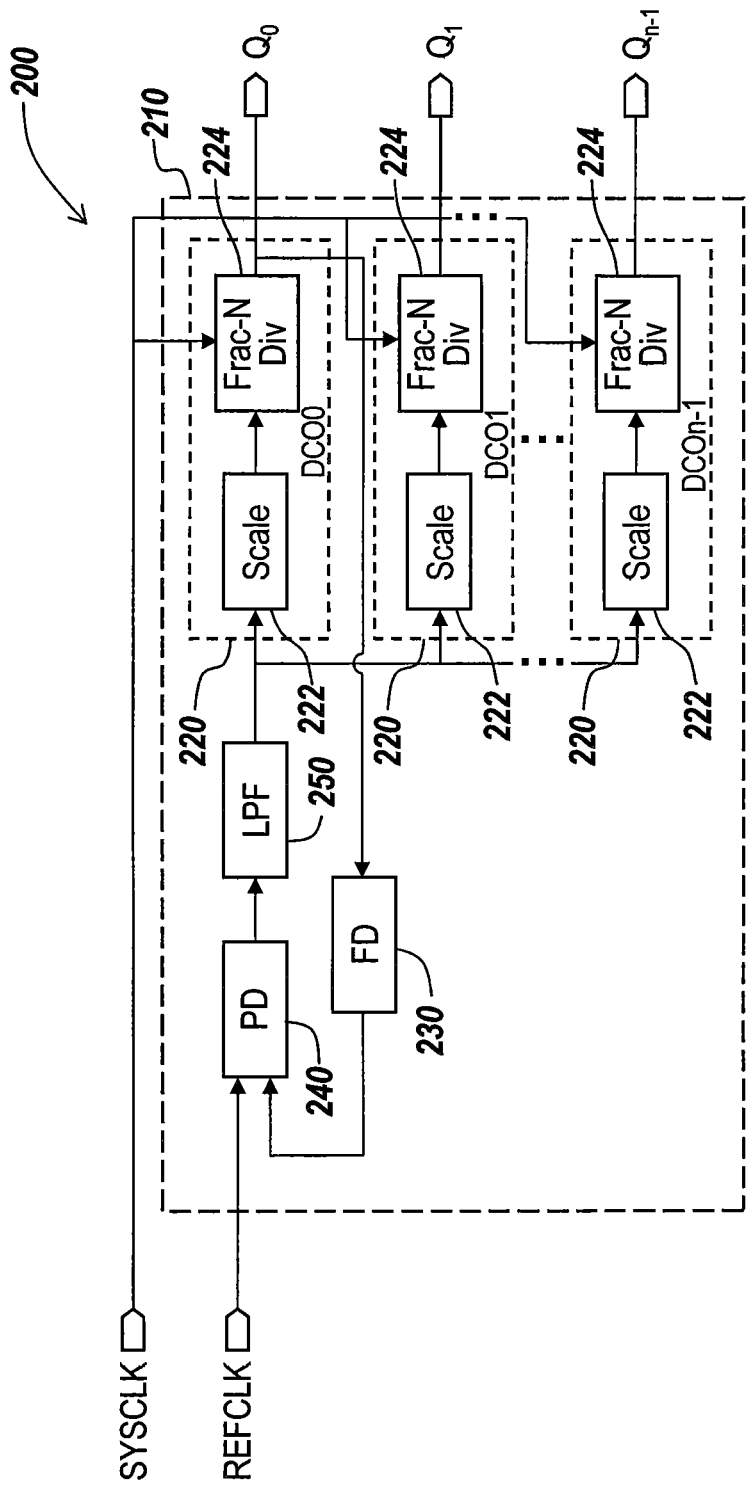
FIG. 6A is a block diagram of a PLL integrated circuit having multiple digitally-controlled oscillators (DCOs) therein that are slaved to the same loop filter, according to embodiments of the invention.

Referring now to FIG. 6A, an integrated circuit device 200 according to embodiments of the invention is illustrated as including a digital phase-locked loop (DPLL) 210 that can generate multiple clock families using multiple independently programmable digitally-controlled oscillators (DCOs) 220 therein that are all slaved to the same loop filter. As shown, the plurality of DCOs 220 (i.e., DCO0 through DCOn−1) generate respective PLL output signals Q0 through Qn−1, which typically have different frequencies set by independently programmable fractional-N (Frac-N) dividers 224, which are responsive to a common system clock (SYSCLK) of relatively high frequency (e.g., 4-15 GHz or higher). Although not shown, SYSCLK may be generated by a system PLL within the integrated circuit device 200 (e.g., packaged chip) or received from an external source. For example, a conventional analog PLL may be used, which locks to a stable local clock (e.g., crystal oscillator) and generates a high quality and high frequency SYSCLK. As will be understood by those skilled in the art, the higher the SYSCLK frequency the better the jitter performance of Q0 through Qn−1.

The loop filter is illustrated as a low-pass filter 250 within a closed-loop frequency control circuit containing a feedback divider (FD) 230 (integer or fractional divisor) having an input terminal responsive to a selected PLL output signal (shown as Q0) and an output terminal electrically coupled to an input "feedback" terminal of a phase detector (PD) 240, which also has an input "reference" terminal responsive to a reference signal (REFCLK) having a lower frequency relative to SYSCLK. For high performance applications, the FD 230 may be a fractional-N divider with phase correction to suppress spurs. The control circuit further includes a loop filter 250, which is illustrated as a low pass filter (LPF). As will be understood by those skilled in the art, the FD 230, PD 240 and LPF 250 may be of conventional design and need not be further described herein. Moreover, according to alternative embodiments of the invention, the PLL loop may be an analog loop (e.g., analog PD and LPF), which contains an analog-to-digital converter (ADC) to convert an analog control signal (e.g., Vc) generated by the LPF into a digital word that is provided to the DCOs 220.

Figure 6B:
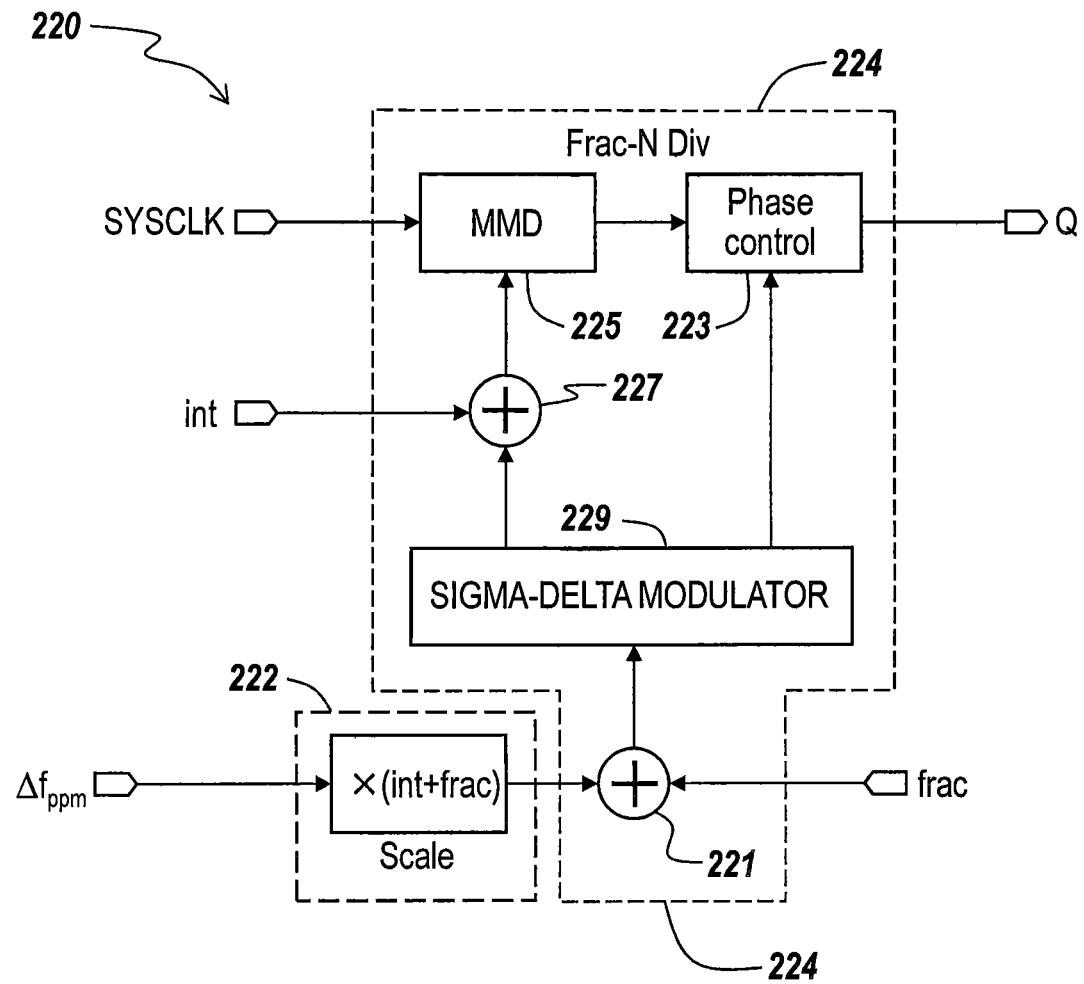
FIG. 6B is a block diagram of a DCO that utilizes control signal scaling to support the generation of multiple clock families by the PLL of FIG. 6A.

Referring now to FIGS. 6A-6B, each of the DCOs 220 includes a scaling circuit 222, which scales a control signal generated by the LPF 250 by a programmed value equal to the divisor (e.g., M/N where M and N are integers and M>N) associated with a corresponding fractional divider 224, which may be configured as disclosed in the aforementioned '587 patent. This control signal may be a digital signal, which is scaled (or normalized) by the scaling circuit 222 to thereby make the effective gains of the DCOs 220 equal and the PLL output signals Q0 through Qn−1 have the same FFO (fractional frequency offset).

In particular, the control signal, which is identified by the symbol Δf (a dimensionless quantity frequently specified in parts-per-million (ppm)), undergoes a plurality of different scaling (a/k/a normalization) operations within each of the scaling circuits 222. As shown, the output of each scaling circuit 222 generates a product of Δf and the divisor "(int+frac)" for the corresponding fractional divider 224. This product is then combined with the fractional divisor component (frac) using a first summation device 221, which provides a first summation output to a modulator 229. This modulator 229 is illustrated as a sigma-delta (ΣΔ) modulator. The modulator 229, along with a second summation device 227, phase control circuit 223 and multi-modulus divider 225 may be configured as conventional components with the fractional divider 224, however, other components of the enhanced fractional divider circuits described herein may also be used.

As will be understood by those skilled in the art, the PLL output signal Q0 will have a frequency $f_{Q0}=(f_{REFCLK})Fb$, where Fb is the divisor of the feedback divider 230 (FD). Moreover, based on the disclosed configurations of the DCOs 220, with scaling, the frequency of the PLL output signal Q0 can also be expressed as $f_{Q0}=f_{sysclk}(1/[(int_0+frac_0)(1+\Delta f)])$. These two relationships for $f_{Q0}$ can be used to calculate the control signal as $\Delta f=f_{sysclk}(f_{refclk}(Fb)(int_0+frac_0))^{-1}-1$. As described hereinabove, this control signal is scaled/normalized to thereby provide a DPLL, which can support multiple clock families within a single timing element. Thus, the DPLL 210 of FIGS. 6A-6B may be used to support multiple communication protocols (e.g., SONET/SDH, SyncE, OTN, etc.) within a single packaged integrated circuit.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A phase-locked loop (PLL) integrated circuit, comprising:
   a frequency control circuit configured to generate a control signal in response to a first periodic reference signal; and
   a plurality of digitally-controlled oscillators (DCOs) configured to generate a respective plurality of periodic PLL output signals of different frequency in response to a second periodic reference signal, said plurality of DCOs comprising respective scaling circuits therein that are each responsive to the control signal.

2. The PLL integrated circuit of claim 1, wherein said plurality of DCOs comprise a corresponding plurality of independently-programmable fractional dividers having different nominal gains; and wherein the plurality of scaling circuits are configured to scale the control signal to different degrees to thereby make effective gains of the plurality of independently-programmable fractional dividers more nearly equal.

3. The PLL integrated circuit of claim 1, wherein said plurality of DCOs comprise a corresponding plurality of independently-programmable fractional dividers having different nominal gains; and wherein the plurality of scaling circuits are configured to scale the control signal to different degrees to thereby make the plurality of periodic PLL output signals have equivalent fractional frequency offsets.

4. The PLL integrated circuit of claim 1, wherein said frequency control circuit comprises a phase detector (PD) having a first input terminal responsive to the first periodic reference signal and a low pass filter (LPF) responsive to a signal generated at an output terminal of the PD; wherein the control signal is derived from a signal generated at an output terminal of the LPF; and wherein a frequency of the second periodic reference signal is greater than a frequency of the first periodic reference signal.

5. The PLL integrated circuit of claim 4, wherein said frequency control circuit further comprises a feedback divider (FD) responsive to one of the plurality of periodic PLL output signals; and wherein a second input terminal of the PD is responsive to a periodic feedback signal generated by the FD.

6. The PLL integrated circuit of claim 2, wherein a first of the plurality of periodic PLL output signals associated with a first of said plurality of independently programmable fractional dividers has a frequency equal to $f_{Q0}$, where $f_{Q0}=f_{sysclk}(1/[(int_0+frac_0)(1+\Delta f)])$, $f_{sysclk}$ designates a frequency of the second periodic reference signal, $int_0+frac_0$ represents a programmed divisor associated with the first of said plurality of independently programmable fractional dividers and Δf is a value of the control signal.

7. The PLL integrated circuit of claim 6, wherein a second of the plurality of periodic PLL output signals associated with a second of said plurality of independently programmable fractional dividers has a frequency equal to $f_{Q1}$, where $f_{Q1}=f_{sysclk}(1/[(int_1+frac_1)(1+\Delta f)])$ and $int_1+frac_1$ represents a programmed divisor associated with the second of said plurality of independently programmable fractional dividers.

8. The PLL integrated circuit of claim 6, wherein said frequency control circuit comprises a feedback divider (FD) responsive to the first of the plurality of periodic PLL output signals; and wherein $\Delta f=f_{sysclk}(f_{refclk}(Fb)(int_0+frac_0))^{-1}-1$, where $f_{refclk}$ designates a frequency of the first periodic reference signal and Fb is the divisor of the FD.

9. A phase-locked loop (PLL) integrated circuit, comprising:
   a digitally-controlled oscillator (DCO) having a fractional-N divider and scaling circuit therein, said DCO configured to generate a PLL output signal Q0 having a frequency equal to $f_{Q0}$ in response to a high frequency system clock signal SYSCLK having a frequency equal to $f_{sysclk}$, where $f_{Q0}=f_{sysclk}(1/[(int_0+frac_0)(1+\Delta f)])$, $int_0+frac_0$ represents integer and fractional components of a programmed divisor associated with the fractional-N divider and Δf is a value of the control signal generated internal to the PLL integrated circuit and received by the scaling circuit.

10. The PLL integrated circuit of claim 9, further comprising a feedback divider (FD), which is responsive to the PLL output signal Q0, and a phase detector (PD), which is responsive to a reference clock signal REFCLK and a feedback signal generated at an output of the FD; and wherein $\Delta f = f_{sysclk}(f_{refclk}(Fb)(int_0+frac_0))^{-1}-1$, where $f_{refclk}$ designates a frequency of the reference clock signal and Fb is the divisor of the FD.

11. A phase-locked loop (PLL) integrated circuit, comprising:
  a plurality of digitally-controlled oscillators (DCOs) configured to generate a respective plurality of periodic PLL output signals of different frequency in response to a periodic reference signal and a common control signal, said plurality of DCOs comprising a corresponding plurality of independently-programmable fractional dividers having different nominal gains and a corresponding plurality of scaling circuits configured to scale the common control signal to different degrees and provide the scaled control signals to the independently-programmable fractional dividers to thereby make effective gains of the plurality of independently-programmable fractional dividers more nearly equal and make the plurality of periodic PLL output signals have equivalent fractional frequency offsets.

* * * * *